United States Patent [19]

Drye et al.

[11] Patent Number: 5,164,885
[45] Date of Patent: Nov. 17, 1992

[54] ELECTRONIC PACKAGE HAVING A NON-OXIDE CERAMIC BONDED TO METAL AND METHOD FOR MAKING

[75] Inventors: James E. Drye; David J. Reed, both of Mesa; Vern H. Winchell, II, Scottsdale, all of Ariz.

[73] Assignee: Motorola, Inc., Schaumburg, Ill.

[21] Appl. No.: 795,441

[22] Filed: Nov. 21, 1991

[51] Int. Cl.⁵ .............................................. H05K 7/20
[52] U.S. Cl. .................... 361/387; 361/386; 361/388; 357/81; 29/840; 29/592.1
[58] Field of Search .................. 357/80, 81; 361/386-389; 29/825, 832, 840, 842, 843, 592.1

[56] References Cited

U.S. PATENT DOCUMENTS 4,554,613  11/1985  Kaufman ........................... 361/386
4,922,378  5/1990   Malhi et al. ....................... 361/387
5,070,936  12/1991  Carroll et al. ..................... 361/387

OTHER PUBLICATIONS

Hazen et al, "Thin Film Protective Coatings for Processing Aluminum Nitride Substrates", ISHM Advanced Technology Workshop-Aluminum Nitride Technology, Mar. 14, 1991.

Primary Examiner—Gregory D. Thompson
Attorney, Agent, or Firm—Stuart T. Langley

[57] ABSTRACT

A non-oxide ceramic (16) for electronic packages and a method of producing electronic packages using a non-oxide ceramic is provided. In accordance with the present invention, the non-oxide ceramic (16) is coated with silicon dioxide (15) and a bonding glass (14) having diboron trioxide is used to attach other package components such as semiconductor chips (18), leadframes (13), and heatsinks (11) to the non-oxide ceramic (16).

15 Claims, 1 Drawing Sheet

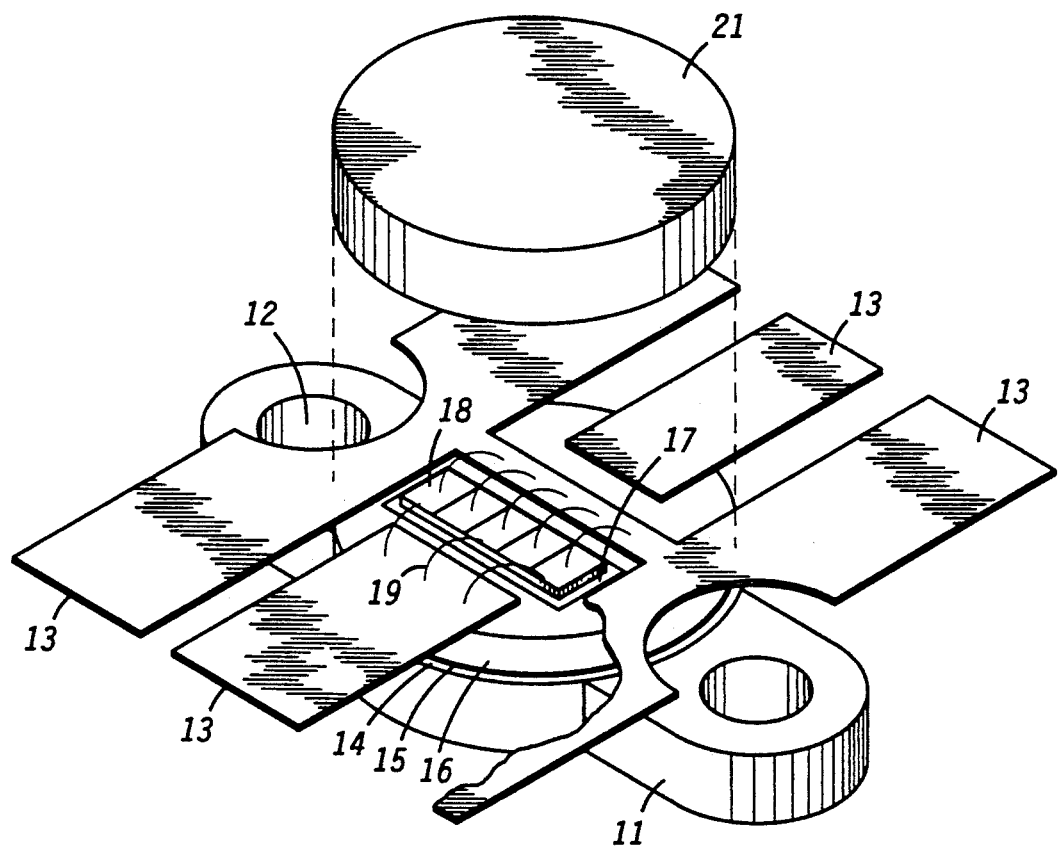

ELECTRONIC PACKAGE HAVING A NON-OXIDE CERAMIC BONDED TO METAL AND METHOD FOR MAKING

BACKGROUND OF THE INVENTION

The present invention relates, in general, to glass bonding to ceramic materials, and more particularly, to glass bonding to non-oxide ceramic materials used in electronic packages.

Electronic packages provide mechanical support, electrical connection, and a means for dissipating heat for integrated circuits. Mechanical support is necessary to facilitate handling and prevent breakage of the integrated circuit during installation or operation of the device. Electrical connections on the packages provide power inputs, interconnects between devices, ground planes, and the like. Heat dissipation is required to avoid severe thermal excursions which would result in decreased reliability and device failure.

Semiconductor trends include increased function density, power density, and speed. These trends create a need for electronic packages having increased wiring density and improved thermal management capability. Many high frequency electronic packages require components comprising low dielectric constant materials. Low dielectric constant materials decrease signal propagation delays in the conductor lines. Lower dielectric constants also decrease electrical noise resulting from capacitance between adjacent conductor lines.

Thermal performance of the package is also an important consideration. High thermal conductivity is desired to avoid severe heating of the device, which can compromise both performance and reliability. Coupled with this is a desire to match thermal expansion of various package components, since some heating is unavoidable. Poor thermal expansion matching can result in substantial stress and mechanical failure at the interfaces between package components.

Ceramics are often chosen for high reliability package components because, in general, they provide the best compromise between dielectric constant and thermal conductivity while being relatively cost competitive for high performance devices. Ceramic packages offer the capability of producing a hermetic package, which can provide superior protection of the IC from harsh environmental conditions and is often required for high reliability applications. Ceramics also have a higher flexure strength than plastic packages and so provide more mechanical protection for the semiconductor chips.

Alumina ($Al_2O_3$) and beryllia (BeO) are the most commonly used ceramics for electronic packages. Although $Al_2O_3$ has relatively low thermal conductivity, it is most often chosen because it is very low cost. BeO provides significantly higher thermal conductivity and significantly lower dielectric constant, however, BeO dust is extremely toxic. Toxicity of BeO has limited its development. Further, both alumina and beryllia have relatively low flexure strength compared to other known ceramics and do not closely match the thermal coefficient of expansion of silicon, a common material used for semiconductor devices.

Accordingly, it is desirable to have a ceramic having high thermal conductivity, high flexure strength, and coefficient of thermal expansion closely matching that of silicon. It is also desirable to have a ceramic material which is compatible with electronic packaging processes for attaching semiconductor chips, leadframes and heatsinks to the ceramic.

SUMMARY OF THE INVENTION

Briefly stated, the advantages of the present invention are achieved by a non-oxide ceramic for electronic packages and a method of producing electronic packages using a non-oxide ceramic. In accordance with the present invention, the non-oxide ceramic is coated with silicon dioxide. A bonding glass comprising diboron trioxide is used to attach other package components including semiconductor chips, leadframes, and heatsinks to the non-oxide ceramic.

As used herein, the words "non-oxide ceramic" mean man-made ceramic materials which are substantially without oxide, such as aluminum nitride (AlN). The term "bonding glass" refers to a mixture of glass powder usually dispersed in a solvent carrier and applied to bond package components together upon firing. The term "package components" refers to components such as substrates, heatsinks, integrated circuits, and leadframes, and the like.

BRIEF DESCRIPTION OF THE DRAWINGS

The sole figure illustrates a partially exploded view of a semiconductor package in accordance with the present invention.

DETAILED DESCRIPTION OF THE DRAWINGS

The sole figure illustrates an example of an electronic package in accordance with the present invention. The package illustrated in the figure is commercially known as a stripline opposed emitter (SOE) package used for high frequency RF power transistors. Such packages offer outstanding thermal characteristics as well as an electrically isolated heatsink 11. It should be understood, however, that although the present invention is illustrated in terms of a discrete electronic device, the present invention is applicable to multi-chip modules, hybrid packages, and the like which often use ceramic components. The present invention and the method of making the present invention have utility wherever ceramic materials are used to conduct heat from a heat generating source such as a semiconductor chip to a heat dissipator such as a heatsink.

Heatsink 11 comprises a thermally conductive material such as copper. Mounting holes 12 are for attaching the electronic package to a circuit board or an external heatsink (not shown). The present invention can be used with a thermally conductive heatsink of any shape, size, or composition. Heatsink 11 may or may not be plated with a protective or solderable material such as gold or nickel.

Non-oxide ceramic component 16 comprises a non-oxide ceramic and in a preferred embodiment, comprises aluminum nitride (AlN). AlN is desirable because it is non-toxic, highly thermally conductive, and relatively inexpensive. Until now, however, manufacturers were unable to use aluminum nitride for non-oxide ceramic component 16 because of an inability to bond non-oxide ceramic component 16 to heatsink 11 with a durable mechanical and chemical bond. In accordance with the method of the present invention, non-oxide ceramic component 16 is bonded to heatsink 11 by bonding glass 14 whose composition will be described in greater detail hereinafter.

A semiconductor chip 18 is mounted to an upper surface of non-oxide ceramic component 16. Because an interface between semiconductor chip 18 and non-oxide ceramic component 16 is comparatively free of stress, a wide variety of techniques may be used to bond semiconductor chip 18 to non-oxide ceramic component 16. Bonding material 17 is deposited or printed onto the upper surface of non-oxide ceramic component 16. Bonding material 17 comprises, for example, a thin or thick metal film and semiconductor chip 18 is attached to bonding material 17 by soldering. Another alternative is epoxy bonding, in which bonding material 17 would comprise epoxy. In an alternative embodiment, bonding material 17 comprises a bonding glass described in greater detail hereinafter with regard to attachment of non-oxide ceramic component 16 to heatsink 11.

A plurality of leads 13 are mounted to the upper surface of non-oxide ceramic component 16 in a manner similar to that used to attach semiconductor chip 18. Wires 19 couple semiconductor chip 18 to leads 13 and serve to couple electrical signals and power between semiconductor chip 18 and external circuitry,(not shown). Cap 21 is bonded to leads 13 and non-oxide ceramic component 16 to protect semiconductor chip 18 and wire bonds 19. Cap 21 may comprise a ceramic or metal and in a preferred embodiment, comprises alumina ($Al_2O_3$).

A notable feature of the present invention is that at least the lower surface of non-oxide ceramic component 16 is covered with silicon dioxide layer 15, illustrated by a heavy bold line in the figure. In a preferred embodiment silicon dioxide layer 15 is approximately 0.15 micrometer thick and is deposited by chemical vapor deposition of oxide at high temperature (HYTOX). It may be convenient to coat all surfaces of non-oxide ceramic component 16 with silicon dioxide layer 15, but for purposes of the present invention, it is only necessary that the lower surface which attaches to heatsink 11 with bonding glass 14 be coated. It has been found that silicon dioxide layer 15 greatly promotes adhesion and chemical bonding between non-oxide ceramic component 16 and bonding glass 14. Without a silicon dioxide layer 15, bonding glass 14 primarily forms a mechanical bond to non-oxide ceramic component 16 which is weaker than the chemical and mechanical bonding provided by the present invention.

Another feature of the present invention is that bonding glass 14 comprises diboron trioxide ($B_2O_3$). Vanadium glasses ($V_2O_5$) are also used as bonding glasses, but it has been found that $B_2O_3$ glass, in combination with the silicon dioxide layer 15 on non-oxide ceramic component 16, provide a reproducible, durable chemical bond between bonding glass 14 and non-oxide ceramic component 16. Bonding glass 14 may also comprise lead oxide (PbO). For maximum thermal conductivity, bonding glass 14 is filled with a high thermal conductivity material such as silver.

Bonding glass 14 is applied to either ceramic 16 or heatsink 11. Heatsink 11 and non-oxide ceramic component 16 are then mounted together and heated to achieve bonding. In a preferred embodiment, the heating step is performed at a temperature above softening temperature of the glass but below the eutectic temperature with $SiO_2$. The $PbO-B_2O_3-SiO_2$ system has a ternary eutectic at 484° C., so holding below 484° C. allows rapid diffusion for chemical bonding to occur without drawing the entire silicon dioxide coating on non-oxide ceramic component 16 into solution. In a preferred embodiment bonding is performed at a temperature in the range of 395° C. to 484° C.

A durable chemical and mechanical bond between the bonding glass and a non-oxide ceramic results from coating the non-oxide ceramic with silicon dioxide and designing the bonding glass and bonding process to result in chemical bonding to the silicon dioxide coating. It has been found that using the method in accordance with the present invention substantially reduces package failure due to separation between the bonding glass and the non-oxide ceramic.

By now it should be appreciated that a non-oxide ceramic with high thermal conductivity and low toxicity is provided and a process for using that non-oxide ceramic for mounting semiconductor devices in semiconductor packages, hybrid, and multi-chip modules is achieved.

We claim:

1. An electronic package comprising:
   a thermally conductive heatsink having a bottom surface for emitting heat and an upper surface;
   a bonding glass layer on the upper surface of the thermally conductive heatsink;
   a non-oxide ceramic package component having upper and lower surfaces; a silicon dioxide coating on at least the lower surface of the non-oxide ceramic, wherein the silicon dioxide coating is bonded to the bonding glass layer;
   a semiconductor chip mounted to the upper surface of the non-oxide ceramic;
   a conductive lead mounted to the upper surface of the non-oxide ceramic; and
   a means for coupling the semiconductor chip to the conductive lead.

2. The electronic package of claim 1 wherein the non-oxide ceramic comprises aluminium nitride (AlN).

3. The electronic package of claim 1 wherein the bonding glass further comprises a mixture of diboron trioxide ($B_2O_3$), and lead oxide (PbO).

4. The electronic package of claim 1 wherein the thermally conductive heatsink comprises copper (Cu).

5. The electronic package of claim 1 wherein the conductive lead comprises copper.

6. The electronic package of claim 1 wherein the bond between the bonding glass and the non-oxide ceramic is chemical and mechanical bond.

7. The electronic package of claim 3 wherein the bonding glass is filled with silver.

8. A method for making an electronic package comprising the steps of: providing a thermally conductive heatsink; providing a non-oxide ceramic component having an upper and a lower surface; forming a silicon dioxide coating at least the lower surface of the non-oxide ceramic component; bonding the thermally conductive heatsink to the silicon dioxide coating on the lower surface of the non-oxide ceramic component using a bonding glass; mounting a semiconductor die to the upper surface of the ceramic component; and mounting a conductive lead to the upper surface of the ceramic component.

9. The method of claim 8 wherein the bonding glass comprises a mixture of diboron trioxide ($B_2O_3$), and lead oxide (PbO) and the step of bonding the thermally conductive heatsink further comprises the steps of applying the bonding glass between the heatsink and the silicon dioxide coating on the lower surface of the non-oxide ceramic component; and heating the bonding glass to a predetermined temperature greater than its softening temperature and less that its eutectic temperature with $SiO_2$.

10. The method of claim 9 wherein the predetermined temperature is in the range of 395° C. to 484° C.

11. The method of claim 8 wherein the step of mounting the semiconductor die further comprises the steps of: forming a silicon dioxide coating on at least the upper surface of the non-oxide ceramic component; providing a bonding glass comprising diboron trioxide ($B_2O_3$); placing the bonding glass between the semiconductor die and the ceramic; and forming a chemical bond between the bonding glass and the silicon dioxide coating.

12. A method for attaching metal to non-oxide ceramic material comprising the steps of: providing a metal; providing a mon-oxide ceramic material; coating the ceramic with silicon dioxide; and bonding the metal to the silicon dioxide using a bonding glass comprising diboron trioxide ($B_2O_3$).

13. The method of claim 12 wherein the step of bonding further comprises: placing the bonding glass between the metal and the ceramic; heating the bonding glass, metal, and ceramic to a predetermined temperature greater than a softening temperature and less than a eutectic temperature of the glass.

14. The method of claim 13 wherein the predetermined temperature is in the range of 395° C. to 484° C.

15. The method of claim 12 wherein the step of bonding the metal further comprises placing the bonding glass between the metal and the ceramic; heating the bonding glass, metal, and ceramic so as to chemically bond the silicon dioxide coating and the $B_2O_3$ in the bonding glass.

* * * * *

UNITED STATES PATENT AND TRADEMARK OFFICE
CERTIFICATE OF CORRECTION

PATENT NO. : 5,164,885

DATED : November 17, 1992

INVENTOR(S) : James E. Drye et al.

It is certified that error appears in the above-identified patent and that said Letters Patent is hereby corrected as shown below:

Column 5, claim 12, line 17, change "mon-oxide" to --non-oxide--.

Signed and Sealed this

Twenty-first Day of June, 1994

Attest:

BRUCE LEHMAN

Attesting Officer        Commissioner of Patents and Trademarks